United States Patent [19]

Fox et al.

[11] Patent Number: 4,954,878
[45] Date of Patent: Sep. 4, 1990

[54] METHOD OF PACKAGING AND POWERING INTEGRATED CIRCUIT CHIPS AND THE CHIP ASSEMBLY FORMED THEREBY

[75] Inventors: Leslie R. Fox, Boxborough; Paul C. Wade, Shirley; William L. Schmidt, Acton, all of Mass.

[73] Assignee: Digital Equipment Corp., Maynard, Mass.

[21] Appl. No.: 373,960

[22] Filed: Jun. 29, 1989

[51] Int. Cl.⁵ ............... H01L 23/02; H01L 23/48; H01L 23/42; H01L 39/02

[52] U.S. Cl. .................... 357/81; 357/70; 357/74; 357/79; 357/80; 361/381; 361/389; 361/398

[58] Field of Search ............... 357/68, 74, 80, 81, 357/79; 361/381, 389, 398

[56] References Cited

U.S. PATENT DOCUMENTS

| | | | |
|---|---|---|---|
| 3,634,807 | 1/1972 | Grobe | 317/101 |
| 3,657,805 | 4/1972 | Johnson | 29/589 |
| 3,896,544 | 7/1975 | Fosnough | 29/588 |
| 4,074,342 | 2/1978 | Honn et al. | 361/411 |
| 4,190,855 | 2/1980 | Inoue | 357/80 |
| 4,202,007 | 5/1980 | Dougherty et al. | 357/80 |
| 4,209,481 | 6/1980 | Kashiro et al. | 264/24 |
| 4,376,287 | 3/1983 | Sechi | 357/80 |
| 4,381,131 | 4/1983 | Demnianiuk | 439/368 |
| 4,407,007 | 9/1983 | Desai et al. | 357/74 |
| 4,413,308 | 11/1983 | Brown | 361/398 |
| 4,548,451 | 10/1985 | Benarr | 339/17 M |
| 4,607,276 | 8/1986 | Butt | 357/79 |
| 4,731,699 | 3/1988 | Nitta et al. | 361/386 |
| 4,774,632 | 9/1988 | Neugebauer | 361/386 |
| 4,814,857 | 3/1989 | Werbizky | 357/74 |

Primary Examiner—Rolf Hille
Assistant Examiner—David M. Ostrowski
Attorney, Agent, or Firm—Nutter, McClennen & Fish

[57] ABSTRACT

An IC chip assembly includes a chip having an array of exposed contacts at a first face thereof, a substrate having an array of exposed contacts at a face thereof and a compliant interposer with exposed contacts at opposite faces thereof positioned between the chip and substrate so that contacts on the opposite faces of the interposer engage the contacts on said chip and substrate, respectively. A thermal transfer member contacts the opposite face of the chip and is engaged to the substrate so as to compress the interposer thereby simultaneously establishing relatively low inductance electrical connections between the chip contacts and the substrate contacts and good thermal contact between the chip and the thermal transfer member. The assembly is particularly adapted to provide power to the chip of a TAB-type integrated circuit assembly which includes a flexible lead frame connected between the chip and the substrate.

24 Claims, 4 Drawing Sheets

METHOD OF PACKAGING AND POWERING INTEGRATED CIRCUIT CHIPS AND THE CHIP ASSEMBLY FORMED THEREBY

This invention relates to a method of packaging and powering integrated circuit chips and to the chip assembly itself. It relates more particularly to a method of simultaneously cooling and providing power to an integrated circuit chip connected electrically by a lead frame to a printed wiring board or other interconnect substrate.

BACKGROUND OF THE INVENTION

High performance IC chips commonly referred to simply as chips, present three concomitant problems, namely, the requirement to connect many signals paths, the delivery of electric power to the chip and the removal of heat from the chip. State of the art chips may only be in the order of 14 millimeters on a side and yet require as many as 500 or more electrical connections in order to receive the necessary power and reference voltages to operate the chip and to distribute the various electrical signals to and from the chip. One common technique for making all of the necessary connections to such a chip is to mount the chip on a flexible lead frame. The lead frame is essentially a flexible circuit or tape having a multiplicity of printed conductors or runs extending from contacts spaced around the periphery of the chip to terminals distributed around the periphery of the lead frame. With the chip being connected thusly to the lead frame, the latter can be connected to a printed wiring board or other interconnect substrate by soldering the lead frame terminals to correspondingly positioned contacts on the substrate.

A chip assembly of this type which also incorporates a heat sink to remove heat from the chip is disclosed in pending U.S. patent application Ser. No. 162,671, filed Mar. 1, 1988, entitled METHOD AND APPARATUS FOR PACKAGING AND COOLING INTEGRATED CIRCUIT CHIPS, which application is assigned to the owner of this application. The so-called TAB or chip-on-tape assembly disclosed in that application can remove heat from the chip and provide a large number of leads for signals, and power and reference voltages. However, the concentration of supply current contact points around the chip perimeter and the associated clustered conductor runs on the lead frame constitute relatively high inductance power connections between the chip and the substrate. This high inductance may sometimes adversely affect the stability of on-chip reference supplies that are subjected to very fast transient current disturbances. Such disturbances can arise, for example, due to simultaneously switching drivers. Current state-of-the art CMOS and ECL chips should be able to handle switching transients in the order of 25 amp/ns without adverse effects on electrical performance. But, the known chip assemblies achieve this level of performance only with difficulty. The delivery of power to the peripheral contacts of a TAB-type chip assembly may also result in a relatively high IR drop of the steady-state (DC) components of the chip and the chip can sometimes suffer electromigration failure in the on-chip power distribution due to excessively high peak current densities.

SUMMARY OF THE INVENTION

In accordance with the present invention, instead of providing power to closely-spaced peripheral contacts of a chip by way of a lead frame, some or all of these voltages are delivered to more widely spaced-apart power contacts on the face of the chip by way of a special compliant interposer which simultaneously urges the chip into intimate heat-exchange contact with a thermal transfer member or heat sink engaging the backside of the chip and establishes power connections directly between the substrate and the chip. This construction greatly reduces the supply path inductance of the assembly and establishes multiple connections to the chip which are distributed over the face of the chip resulting in an improved and more robust distribution network for the AC and DC power to the chip.

The invention accordingly comprises the several steps and the relation of such steps with respect to each of the others, and the features of construction, combination of elements and arrangement of parts which are adapted to effect such steps, all as exemplified in the following detailed description, and the scope of the invention will be indicated in the claims.

DESCRIPTION OF THE PREFERRED EMBODIMENTS

Figure 1:
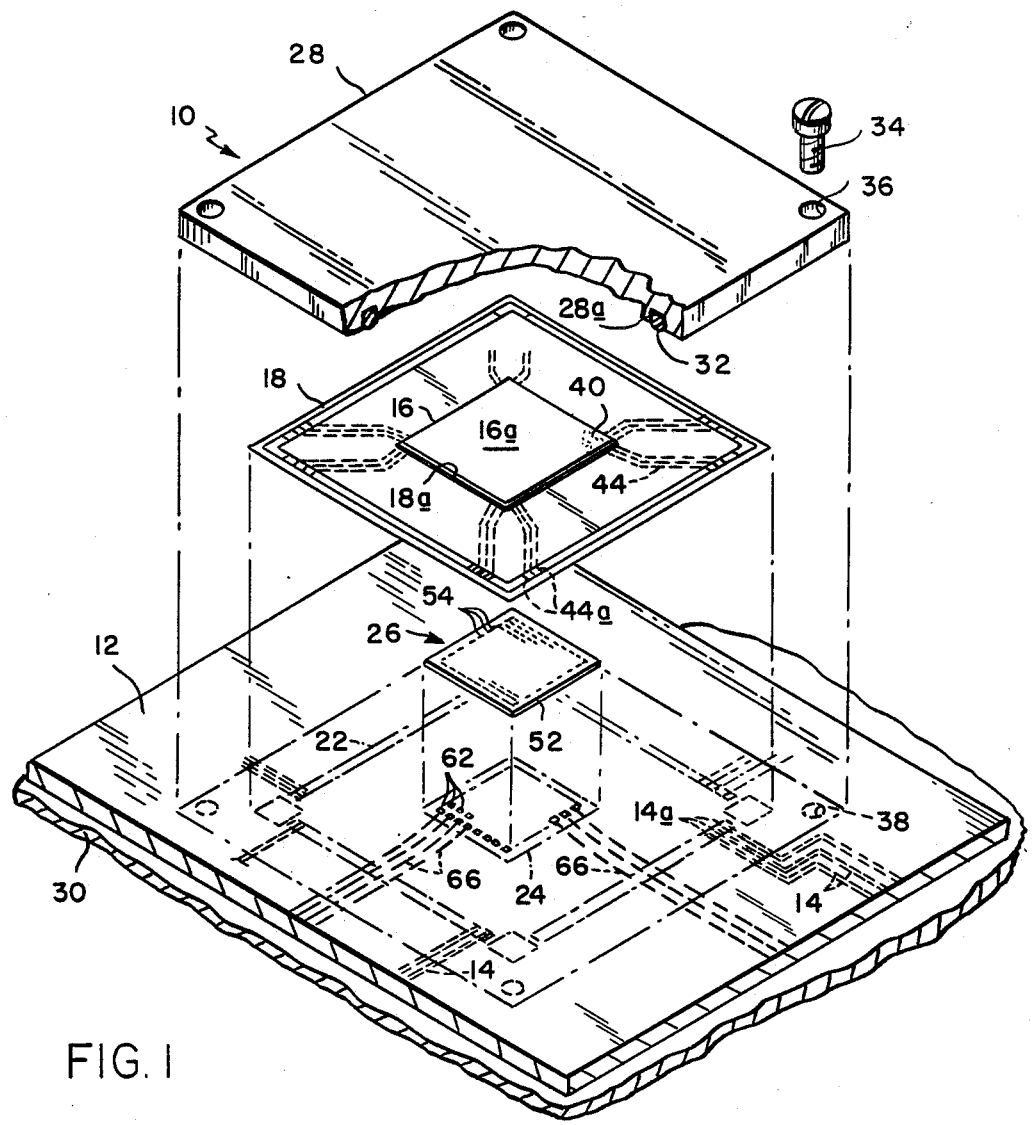
FIG. 1 is an exploded isometric view of a chip assembly embodying our invention.

FIG. 1 of the drawings shows a chip assembly 10 including an interconnect substrate 12 such as a printed wiring board or the like having an array of conductors or runs 14. Assembly 10 also includes an integrated circuit chip 16 mounted, circuit-side-down, in an opening 18a at the center of a flexible lead frame or tape 18. Preferably, substrate 12, chip 16 and lead frame 18 embody the tape applied bonding (TAB), also known as chip-on-tape (COT), technique disclosed in the above-identified pending patent application, the contents of which are incorporated by reference herein.

Lead frame 18 is arranged to be positioned at a site 22 on substrate 12 with the chip 16 overlying a small site 24 in the middle of site 22. Sandwiched between chip 16 and substrate 12 at site 24 thereon is a special compliant interposer 26 which simultaneously establishes certain electrical connections between chip 16 and substrate 12 and provides vertical compliance between the chip and the substrate, as will be described in more detail later. Overlying chip 16 and tape 18 is a thermal transfer member in the form of a heat sink cover 28. When interposer 26 and lead frame 18 are positioned against substrate 12 at sites 24 and 22, respectively, cover 28 can engage substrate 12 so that it completely covers chip 16, lead frame 18 and interposer 26.

As shown in FIG. 1, a channel 28a may be provided in the underside of cover 28 which extends all around the edge margin of the cover. Seated in channel 28a is a gasket which projects slightly from the underside of cover 28. When the cover is engaged to substrate 12, the gasket provides a fluid-tight seal all around assembly 10. Cover 28 may be held in place against substrate 12 by appropriate fasteners 34 which extend through corner holes 36 in cover 28 and through registering holes 38 in substrate 12 and engage into a base or support member 30 underlying substrate 12. When cover 28 is seated against substrate 12, it protectively encloses all of the internal components of the chip assembly 10. Also, the underside of cover 28 contacts the upper face 16a (i.e., backside) of chip 16 so that member 28 can conduct heat away from the chip. To enhance such heat transfer, the upper face 16a of chip 16 may be coated with a lubricant 40 such as polyphenyl ether (PPE) as described in the aforesaid patent application.

Figure 2:
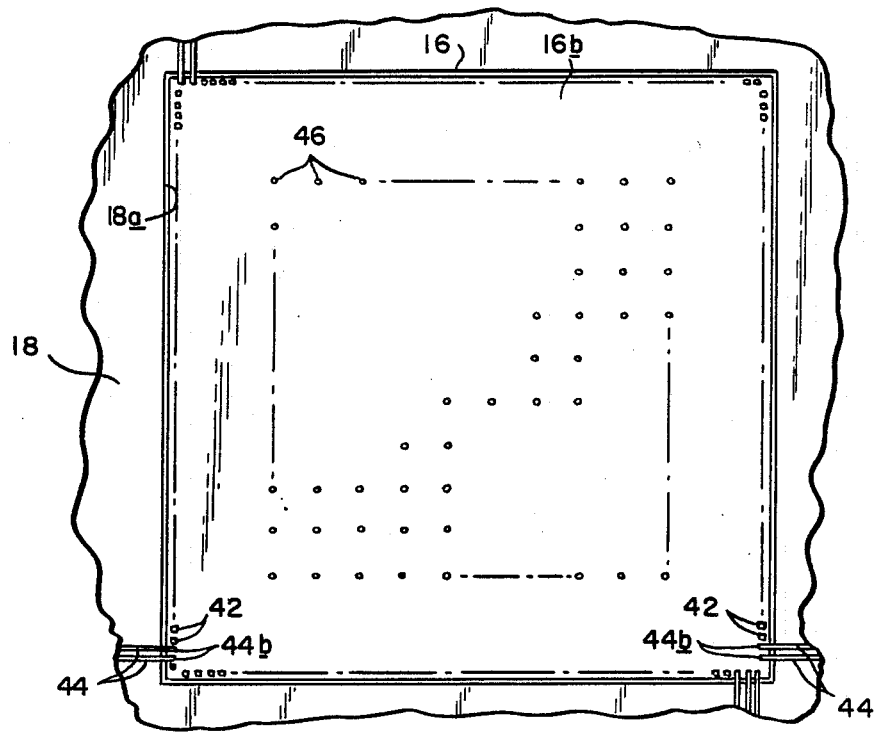
FIG. 2 is a fragmentary bottom plan view on a larger scale of the mounted chip in the FIG. 1 assembly.

As shown in FIG. 2, the lower face 16b (i.e., circuit side) of chip 16 may be provided with a peripheral array of contact pads 42 by which certain internal electrical components of the chip are connected by lead frame 18 and substrate 12 to the outside world. A typical chip 16, which may be in the order of 14 millimeters on a side, may have as many as 130 or more contact pads on each of the four edge margins of the chip.

As best seen in FIGS. 1 and 2, a multiplicity of conductor runs 44 are provided on lead frame 18. Each run 44 may extend from a contact 44a at an outer edge of the lead frame to a tab 44b which overhangs the opening 18a in the lead frame such that each tab 44b underlies a contact 42 on chip 16. The contacts 42 may be coated with solder and the tabs 44b connected electrically and mechanically to pads 42 by heating the tabs and pads momentarily, e.g. with a thermode or laser, so as to remelt the solder. Of course, other means may be used to mechanically and electrically connect the contacts of the lead frame and chip such as conductive cement, etc. Preferably, the contacts 44a at the outer edges of the lead frame 18 are similarly connected to contact pads 14a at the ends of the conductor runs 14 on substrate 12. As shown in FIG. 1, these pads 14a are spaced around the periphery of the substrate site 22.

Unlike prior chip assemblies, such as the ones described in the above-identified patent application, not all of the connections to chip 16 are made by way of the peripheral contacts 42. Rather, as shown in FIG. 2, there is also an array of contacts at the center of the chip. In the illustrated chip embodiment, the contacts are bump-type contacts or bumps 46 arranged in a 10×10 square, the bumps being spaced relatively far apart, i.e., in the order of 1 millimeter, from their neighbors. Preferably the bumps are of a highly electrically conductive, inert metal such as gold.

Figure 3:
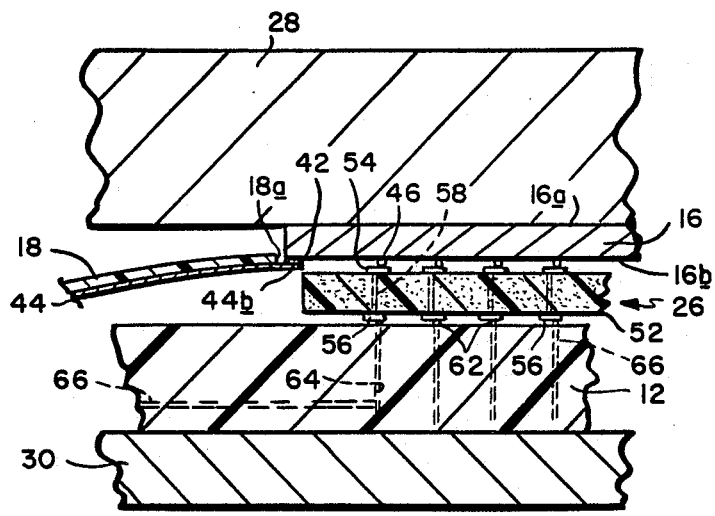
FIG. 3 is a partial cross sectional view on a still larger scale of the assembly.
Figure 5:
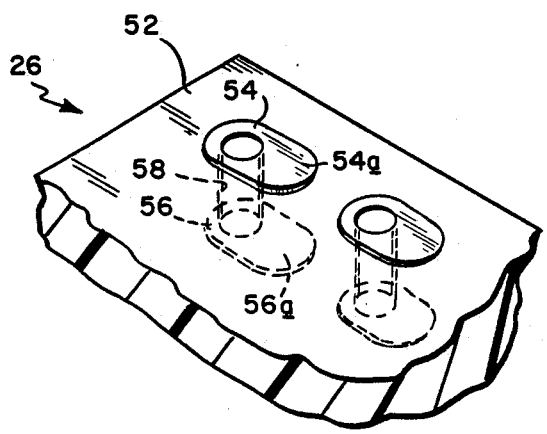
FIG. 5 is a fragmentary isometric view of a portion of the FIG. 4 assembly.

As best seen in FIGS. 1, 3 and 5, the interposer 26 component of assembly 10 comprises a compliant resilient pad or cushion 52 which conforms generally to the size and shape of chip 16, or at least to the area at the underside thereof encompassing the array of bumps 46. Pad 52 may be composed of an electrically insulating compliant material having a relatively low modulus to avoid high stresses on chip 16 when the interposer is compressed between chip 16 and substrate 12. Silicone rubber and Viton brand fluoroelastomer have been shown to be suitable pad materials.

An array of contacts 54 may be applied to the upper surface of pad 52 which contacts correspond to, and are arranged to register with, the bumps 46 on chip 16. Thus, in the illustrated interposer 26, there are 100 such contacts 54 arranged in a 10×10 square. A similar array of contacts 56 may be provided on the underside of pad 52, each contact 56 being located under a corresponding contact 46 on the upper surface of the pad. Each pair of opposing contacts 46, 56 may be connected electrically by a plated via 58. The arrays of contacts and vias in pad 52 can be formed by drilling an array of holes in the pad and depositing a highly conductive metal or sequence of metals, (e.g., copper, nickel, gold) on the upper and lower surfaces of pad 52 and on the walls of the holes using conventional photopatterning and electroplating or metal deposition processes. When the interposer 26 is positioned properly at the underside of chip 16 as shown in FIG. 3, its contacts 54 and 56 underlie the contact bumps 46 of the chip.

Figure 4:
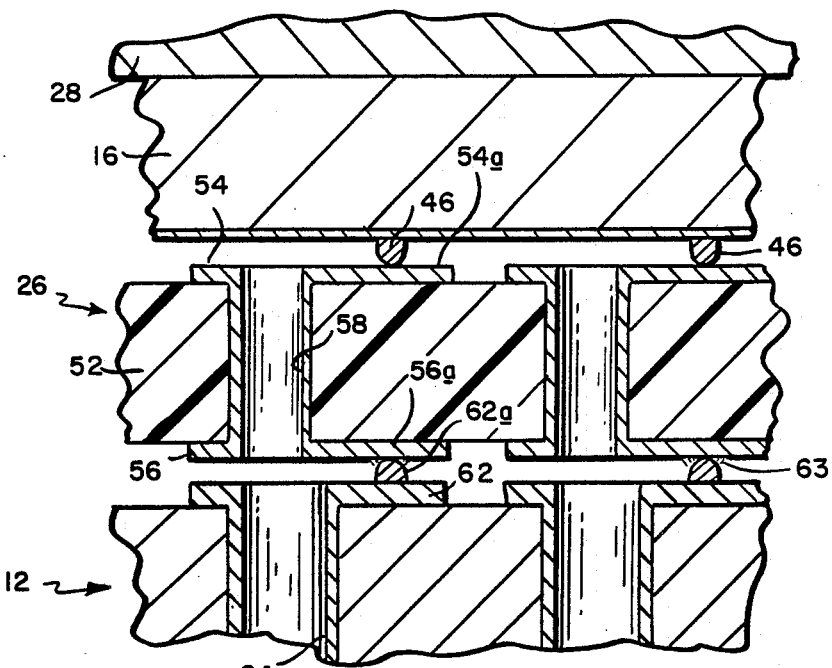
FIG. 4 is a similar view on a still larger scale showing portions of the assembly in greater detail.

Referring to FIGS. 4 and 5, to enhance the compliance of interposer 26, preferably the interposer contacts 54 are cantilevered as shown and the contacts are located on pad 52 so that the free ends 54a of those contacts are engaged by the chip bumps 46 to achieve an offset contact with the bumps. The contact ends 54a are able to flex to some extent relative to the vias 58, the objective being to achieve a resilient engagement of the interposer 26 with the chip bumps 46 which will maintain chip 16 in intimate heat exchange contact the heat-sink cover 28, yet not be so strong or stiff as to fatigue or otherwise damage contacts 46 and 54 or unduly stress chip 16.

Referring to FIGS. 1, 3 and 4, the contacts 56 at the underside of interposer 26 are arranged to contact a corresponding array of contacts 62 at the site 24 on substrate 12. Preferably, the contacts 56 are also cantilevered with their free ends 56a being arranged to engage bumps 62a on contacts 62 as best seen in FIG. 4, again to minimize stresses on chip 16. The substrate bumps 62 may be connected electrically by plated vias 64 to various embedded conductors 66 in substrate 12 that deliver power and/or reference voltages to chip 16.

When assembling chip 16, lead frame 18 and interposer 26 to substrate 12, the contacts on at least one face of the interposer (i.e. interposer-to-chip or interposer-to-substrate) should preferably be separable to facilitate the precision fine alignment of the outer ends 44a of the lead frame conductors 44 to the contact pads 14a of substrate 12. Since the latter features are in the order of 10 times finer than the interposer contacts 54, 56, proper alignment of the former features virtually guarantees alignment of the separable contacts of the interposer 26 with the chip contacts 46 or the substrate contacts 62. In the illustrated assembly, for example, the upper interposer contacts 54 are separable and the lower contacts 56 are connected to the substrate contacts 62 by solder joints 63 as shown in FIG. 4.

When the heat-sink cover 28 is assembled to base 30, the resilient interposer 26 is compressed sufficiently to maintain chip 16 in intimate thermal contact with cover 28. The interposer also provides compliance for vertical tolerance which may exist due to warp and non-planarity between chip 16 and substrate 12. The resilient interposer also assures minimum electrical contact forces between the separable contacts 54 on interposer 26 and the opposing contact bumps 46 on chip 16 without excessive stress on the chip 16 or risk of failure of those contacts due to metal fatigue.

Assembly 10, by virtue of its distributed contact bumps 46 on chip 16 and its special compliant interposer 26, provides very low inductance connections of power from substrate 12 to chip 16. Preferably, the connection of each supply voltage or reference voltage to chip 16 will be provided by multiple redundant contacts to insure against the possibility of any single point failure of the power distribution. Usually, most, if not all, of the power connections to chip 16 will be provided by way of interposer 26, with the signal connections to the chip being provided by lead frame 18. However, it is also contemplated that some power connections may be provided through an appropriate number and disposition of the lead frame conductors 44, the particulars being dictated by specific design and application requirements.

The chip assembly 10 is completely compatible with the packaging technique disclosed in the above cited pending application thereby preserving the cost, flexibility and manufacturing advantages of the TAB technology disclosed in that application, while providing improved power distribution similar to fully bumped chip interconnections currently in use. The low inductance power connections to the chip minimize disturbance of on-chip references due to rapid current transients arising from the action of many simultaneously switching drivers. Reference voltage connection through the interposer 26 also improves on-chip reference stability while preserving the thermal and mechanical advantages of TAB or chip-on-tape assemblies.

Figure 6:
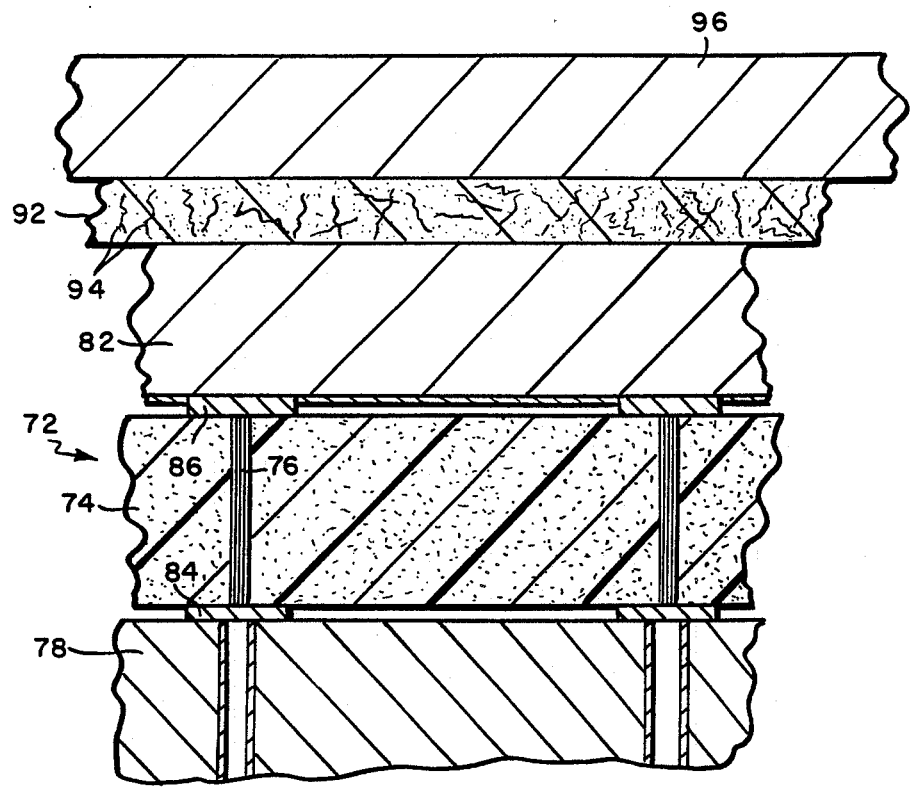
FIG. 6 is a view similar to FIG. 4 of another chip assembly embodiment.
Figure 7:
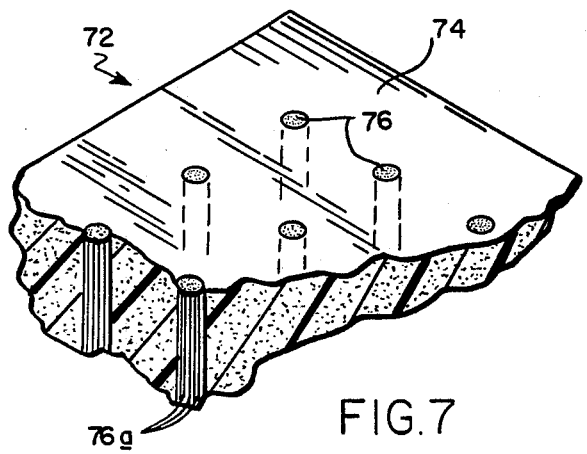
FIG. 7 is a view similar to FIG. 5 showing a portion of the FIG. 6 assembly in greater detail.

FIGS. 6 and 7 illustrate another interposer embodiment shown generally at 72 which is suitable for a chip having flat power contacts at the underside of the chip. Interposer 72 comprises a compliant pad or cushion 74 having an array of wire bundles 76 extending between its upper and lower surfaces which renders pad 74 electrically anisotropic. The interposer 72 is arranged to be sandwiched between a substrate 78 and a chip 82 in the same way described above to electrically connect contacts 84 on the upper surface of substrate 78 to flat contacts 86 at the underside of chip 82. The contacts 84 and 86 should be relatively large in comparison to the cross sections on bundles 76 to provide large contact targets for the wire bundles 76. Preferably, the wires 76a of each bundle 76 provide a multiplicity of redundant wire contacts with the corresponding pads 84 and 86 at opposite ends of that bundle.

Instead of providing a separate heat-sink cover over each chip and lead frame, as shown in FIG. 1, a thermal transfer member in the form of a compliant thermally-conductive pad 92 may be positioned on each chip as shown in FIG. 7. The illustrated pad 92 is composed of an elastomeric material having a multiplicity of fine thermally conductive strands or wires 94 embedded in the material, making pad 92 thermally conductive throughout its extent. Positioned on pad 92 is a heat-sink cover 96, a lubricant similar to lubricant 40 preferably being provided on the opposite faces of pad 94 to assure efficient heat transfer from chip 82 to heat-sink cover 96. This construction is advantageous when a multiplicity of chip assemblies are mounted to a single substrate 7. Each assembly may have a pad 94 to provide additional vertical compliance for that assembly and to conduct heat away from the chip in that assembly to a single heat-sink cover 96 which would protectively enclose all of the assemblies on the substrate. Alternatively, a single thermal transfer pad may overlie all of the chips on the substrate with a single heat-sink cover engaging over the pad to form a sandwich.

Although certain preferred embodiments of the invention have been illustrated specifically, it will be understood that certain changes may be made in the above constructions without departing from the scope of the invention. For example, other means, such as conductive particles embedded in the interposer, may be used to connect the contacts on opposite surfaces of the interposer. Also, in some applications, the compliant interposer feature may be provided by a suitable array of contacts with underlying compliant pads integral to the substrate. Therefore, it is intended that all matter contained in the above description or shown in the accompanying drawings shall be interpreted as illustrative and not in a limiting sense.

It is also understood that the following claims are intended to cover all of the generic and specific features of the invention herein described.

We claim:
1. An IC chip assembly comprising
a chip having an array of exposed contacts at a face thereof;
a substrate having an array of exposed contacts at a face thereof;
interposer means positioned between said chip and substrate, said interposer means including electrically insulating compliant means for providing compliance between said chip and said substrate, said compliant means having first and second opposite surfaces which face said chip and substrate respectively, first exposed contacts at said first surface of the compliant means which engage the contacts on the chip, and second exposed contacts at said second surface of the compliant means which engage the contacts of the substrate;
connecting means electrically connecting said first and second contacts;
thermal transfer means engaging the face of said chip opposite said first face thereof; and
compressing means for compressing said interposer means between said substrate and said thermal transfer means, said interposer means thereby simultaneously providing compliance between said chip and substrate, establishing relatively low inductance electrical connections between the array of chip contacts and the array of substrate contacts and good thermal contact between said chip and said thermal transfer means.

2. The chip assembly defined in claim 1 wherein the contacts of said chip are contact bumps raised from said chip first face, and said first contacts of the interposer means are relatively flat pads which are engaged by said bumps.

3. The chip assembly defined in claim 2 wherein said connecting means comprise conductors extending through said compliant means between selected first and second contacts thereon.

4. The chip assembly defined in claim 3 wherein each first contact is cantilevered from its said conductor and is engaged by a said chip contact bump at a location offset along said contact from that conductor to provide a compliant connection between said conductor and said chip bump.

5. The chip assembly defined in claim 3 wherein each second contact is cantilevered from its said conductor and is engaged by a substrate contact at a location offset along said second contact from that conductor to provide a compliant connection between said conductor and said substrate contact.

6. The chip assembly defined in claim 3 wherein said contacts are of gold or other relatively inert metal.

7. The chip assembly defined in claim 2 wherein said compliant means are of Viton fluoroelastomer or silicone rubber.

8. The chip assembly defined in claim 3 wherein said conductors are plated vias extending through said compliant means between said first and second contacts thereon.

9. The circuit chip assembly defined in claim 1 wherein the contacts on the chip are relatively flat pads and said first contacts on the interposer means have bumps which engage said pads.

10. The chip assembly defined in claim 9 wherein said conductors comprise bundles of tiny electrically conductive strands embedded in said compliant means and whose opposite ends are exposed at the first and second faces of said compliant means.

11. The chip assembly defined in claim 1 wherein
said thermal transfer means comprises a heat-sink cover member which overlies and protectively encloses said chip, said interposer means and the contacts thereon, and
means for securing together said member and said substrate.

12. The chip assembly defined in claim 1 wherein said thermal transfer means comprise a compliant pad and a multiplicity, of thermally conductive strands embedded in said pad throughout substantially its entire extent.

13. The circuit chip assembly defined in claim 12 and further including a heat-sink cover member which overlies and protectively encloses said chip, said interposer means and said compliant pad.

14. The circuit chip assembly defined in claim 1
wherein the contact array on said chip is spaced from the periphery of said chip first face; and
further including additional chip contacts exposed at said chip first face, additional substrate contacts exposed at said substrate face, and a flexible circuit lead frame mechanically and electrically attached at a first end thereof to said additional chip contacts and at a second and thereof to said additional substrate contacts.

15. The chip assembly defined in claim 14 wherein said chip and said lead frame form a TAB-type integrated circuit.

16. The chip assembly defined in claim 14 wherein at least one of said pad first contacts and said pad second contacts are connected electrically but not mechanically to the contacts with which they are engaged.

17. The chip assembly defined in claim 14 wherein the contacts in said array of contacts on said chip include power contacts therefor, and
said additional chip contacts include signal contacts therefor.

18. An IC chip assembly comprising
a chip having an array of exposed contacts at the periphery of a first face thereof and additional chip contacts exposed at said chip first face;
a substrate having an array of exposed contacts at a face thereof and additional substrate contacts at said substrate face;
interposer means positioned between said chip and substrate, said interposer means including electrically insulating compliant means for providing compliance between said chip and said substrate, said compliant means having first and second opposite surfaces which face said chip and substrate respectively, first exposed contacts at said first surface of the compliant means which engage the said additional contacts of the chip, and second exposed contacts at said second surface of the compliant means which engage said additional contacts of the substrate;
connecting means electrically connecting said first and second contacts;
a flexible circuit lead frame mechanically and electrically attached at a first electrical end thereof to said array of chip contacts, and at a second electrical end thereof to said array of substrate contacts; and
means for engaging said chip, interposer means and substrate together so that said interposer means provides compliance between said chip and said substrate and establishes relatively low inductance electrical connections between said additional contacts of said chip and said substrate.

19. The chip assembly defined in claim 18 wherein said chip and said lead frame form a TAB-type integrated circuit.

20. The chip assembly defined in claim 18 wherein at least one of said first contacts and said second contacts are connected electrically but not mechanically to the contacts with which they are engaged.

21. The chip assembly defined in claim 18 wherein the contacts in said array of contacts on said chip include power contacts therefor, and
said additional chip contacts include signal contacts therefor.

22. The chip assembly defined in claim 18 wherein said connecting means are included in said interposer means.

23. The chip assembly defined in claim 18 wherein said compliant means consist of a resilient dielectric pad sandwiched between said chip and said substrate.

24. An IC chip assembly comprising
a chip having an array of exposed contacts at the periphery of a first face thereof and additional chip contacts exposed at said chip first face;
a substrate having an array of exposed contacts at a face thereof and additional substrate contacts exposed at said substrate face;
interposer means located between said chip and said substrate, said interposer means including first compliant contacts engaging said additional chip contacts, second compliant contacts engaging said additional substrate contacts and conductors electrically connecting selected ones of said first and second contacts;
a lead frame mechanically and electrically connected at a first electrical end thereof to said array of chip contacts, and at a second electrical end thereof to said array of substrate contacts;
heat sink means engaging the face of said chip opposite said first face thereof; and
means for engaging said chip, interposer means, substrate and heat sink means together so that said interposer means simultaneously provides compliance between said chip and said substrate and establishes relatively low inductance electrical connections between said additional chip and substrate contacts and good thermal contact between said chip and said heat sink means.

* * * * *